(12) United States Patent
Rich

(10) Patent No.: US 6,216,339 B1
(45) Date of Patent: *Apr. 17, 2001

(54) TOOL-ACTUATED EJECTOR MECHANISM FOR EXTRACTING ELECTRONIC MODULAR COMPONENTS

(75) Inventor: Daniel Rich, Natick, MA (US)

(73) Assignee: 3Com Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/074,743

(22) Filed: May 8, 1998

(51) Int. Cl.[7] .............................. B23K 19/04; H05K 5/00
(52) U.S. Cl. ........................... 29/762; 29/764; 29/426.5; 29/267; 439/157; 361/754
(58) Field of Search ..................... 29/764, 762, 426.5, 29/426.1, 267; 439/152, 153, 157, 327, 328; 361/726, 754, 759, 798; 403/6, 9

(56) References Cited

U.S. PATENT DOCUMENTS

| | | | |
|---|---|---|---|
| 3,896,535 | * | 7/1975 | Tucci ..................................... 29/762 |
| 4,083,616 | * | 4/1978 | McNiece et al. ..................... 439/157 |
| 4,307,510 | * | 12/1981 | Sawyer et al. ......................... 29/267 |
| 4,537,454 | | 8/1985 | Douty et al. . |
| 4,603,375 | | 7/1986 | Miller et al. . |
| 4,999,744 | | 3/1991 | Blankenship . |
| 5,179,505 | | 1/1993 | Matsuo . |
| 5,222,897 | | 6/1993 | Collins et al. . |
| 5,283,713 | * | 2/1994 | Nagafuji et al. ..................... 439/328 |
| 5,321,962 | * | 6/1994 | Ferchau et al. ...................... 361/726 |
| 5,325,264 | * | 6/1994 | Kirk et al. ............................ 361/754 |
| 5,353,475 | * | 10/1994 | Fischbach ........................... 29/426.5 |
| 5,368,493 | * | 11/1994 | O'Brien et al. ..................... 439/153 |
| 5,383,789 | | 1/1995 | Watanabe . |
| 5,398,164 | * | 3/1995 | Goodman et al. .................. 361/759 |
| 5,414,594 | * | 5/1995 | Hristake .............................. 361/798 |
| 5,536,180 | * | 7/1996 | Ishida et al. ......................... 439/157 |

* cited by examiner

*Primary Examiner*—Lee Young
*Assistant Examiner*—A. Dexter Tugbang
(74) *Attorney, Agent, or Firm*—Michaelson & Wallace; Peter L. Michaelson

(57) ABSTRACT

A tool-actuated ejector for extracting electronic modular components. The ejector, which functions as a levered cam, has a body with a first end, a second end and a pivot located intermediate the first and second ends. A tool-receiving socket mounts at the second end. A tool, such as a screwdriver with a blade that matches the shape of the socket, actuates the ejector by applying a force to the socket. A cam, located at the first end, engages the electronic modular component. To provide a mechanical advantage, the distance between the tool-receiving socket and the pivot, which constitutes one lever arm, is greater than the distance between the cam and the pivot, which constitutes a second lever arm. In addition, a shock absorber mounts on the body and gliders extend below the body to provide stability and balance to the ejector. The ejector mounts in a casing having a tool passage that communicates with the tool-receiving socket and the exterior of the casing.

14 Claims, 6 Drawing Sheets

TOOL-ACTUATED EJECTOR MECHANISM FOR EXTRACTING ELECTRONIC MODULAR COMPONENTS

BACKGROUND OF THE INVENTION

1. Field of the Invention

The present invention relates generally to electronic modular structures. More particularly, the invention relates to tool-actuated ejectors for extracting modular components plugged into electronic devices.

2. Description of the Prior Art

Modular construction techniques are widely used to manufacture a variety of electronic equipment, such as personal computers (PC's), peripheral devices, networking equipment, and the like. With modular construction, manufacturers can assemble, at markedly low cost, a variety of systems using different combinations of pre-assembled modular circuits. The versatility of modular construction also permits computer vendors to construct complex systems having varying optional functions and capabilities by simply adding, at a point of sale, modular components to basic units initially provided by manufacturers. In addition, modular construction allows an end user with only moderate skill to repair, upgrade and/or re-configure electronic equipment. In most instances, replacing and/or adding modular electronic circuits to a basic system requires no more than a simple screwdriver and minimal mechanical skill.

Manufacturers design many modular circuits as printed circuit boards (PCB's). Conventional PCB's, frequently called circuit boards or cards, normally carry an electrical connector that mates with a matching connector mounted on a separate component, such as another PCB (e.g., a motherboard). The matching connectors are ordinarily of the plug-in type wherein protruding conductive pins and/or edge contacts of a male connector mate with corresponding electrical sockets of a female connector. The sockets usually include resilient or spring-loaded electrical contacts that tightly grip the protruding edge contacts or pins of the male connector.

During manual installation of most circuit boards, guides and/or grooves located on or within a casing help position and guide the boards as their connectors plug into appropriate connectors within the casing. The restrictive forces exerted by the electrical contacts of a typical connector socket, in addition to any other forces exerted by guides and/or mounting structures, generally provide sufficient mechanical support to hold a circuit board in place. In some situations, however, manufacturers need to add special board fasteners to help secure circuit boards. The use of fasteners becomes especially important when parts of a modular component are exposed to the exterior of a casing. For instance, many circuit boards, such as expansion boards, mount within individual expansion slots having openings located in the front, side or back panels of a casing. In those instances, screws, springs, detents and the like often secure the circuit boards to the casing or to a fixed support located within the casing.

When manually removing an ordinary circuit board from a slot, an individual first removes any special fasteners, and then simply grasps the board with a hand and pulls the board free. Individuals normally have no problem in manually overcoming the restricting forces exerted by standard plug-in connectors, guides and similar supports. However, the extraction forces for some plug-in connectors are too large for most individuals to safely perform manual removal of a circuit board. When applying excessive extraction forces to a plug-in connector, a user will often twist or bend a board or a component, causing damage to pin and socket contacts or other delicate structures. In other instances, where circuit boards mount in crowded spaces, neighboring circuit boards often block a user's hand or otherwise prevent the user from applying sufficient extraction force to a circuit board. To avoid these and similar problems, some manufacturers provide mechanical ejectors that individuals can manually actuate to help extract a plugged-in circuit board or other component.

The following United States patents illustrate prior art ejectors for circuit boards and similar modular electronic components: McNiece et al, U.S. Pat. No. 4,083,616 issued Apr. 11, 1978; Miller et al, U.S. Pat. No. 4,603,375 issued Jul. 29, 1986; and Blankenship, U.S. Pat. No. 4,999,744 issued Mar. 12, 1991. The ejectors of these patents generally comprise levered cams that individuals operate manually to perform a safe, controlled extraction of a circuit board or other component. Specifically, a user manually operates a lever while an attached cam exerts a force in an appropriate direction at a suitable safe point on a component being extracted. Essentially, the combination of the lever and the cam provide a user with sufficient mechanical advantage so that the user can easily overcome the particular extraction force required to unplug a component.

Although currently available ejectors have served the purpose, they have not proved entirely satisfactory when an ejector and/or its associated modular component mounts on the exterior of a casing or in unprotected areas within a casing. Manufacturers have found that exposed surfaces of an ejector often present a hazard to equipment and/or personnel using the equipment. For example, users, onlookers or other individuals may inadvertently actuate an exposed ejector, thereby unwittingly displacing or damaging its associated component. More seriously, accidental ejection of and/or tampering with some electronic components can cause injury from electric shock. Thus, those concerned with the development of modular electronic equipment have recognized the need for improving such equipment to forestall accidental actuation of an ejector and discourage tampering with potentially hazardous electronic devices.

SUMMARY OF THE INVENTION

The present invention satisfies this need in the art by providing a tool-actuated ejector for extracting electronic modular components. One aspect of the present invention includes an ejector having a body with a first end, a second end and a pivot located intermediate the first and second ends. A tool-receiving socket mounts at the second end. A cam, located at the first end, engages the electronic modular component. To provide a mechanical advantage, the distance between the tool-receiving socket and the pivot is greater than the distance between the cam and the pivot. In addition, a shock absorber mounts on the body and a plurality of gliders extends below the body to provide stability and balance to the ejector.

Another aspect of the invention involves an electronic apparatus having a modular component and a component ejector mounted in a casing. A first plug-in connector also mounts in the casing. A second plug-in connector, which mounts on the modular component, mates with the first plug-in connector. An ejector for extracting the modular component from the first plug-in connector comprises a body having first and second ends. The ejector mounts on a pivot in the casing at a point that is located intermediate the first and second ends. A tool-receiving socket mounts on the body at the second end. A cam, located at the first end, engages the electronic modular component. In addition, the casing includes a tool passage communicating with the tool-receiving socket and the exterior of the casing.

Still a further aspect of the invention includes a method of extracting a modular component plugged into an electronic apparatus. The method includes the following steps: forming a rigid lever having first and second arms joined at a pivot, the first arm being longer than the second arm; placing a free end of the second arm into engagement with the modular component; coupling a tool to a free end of the first arm; and forcing the tool against the free end of the first arm to rotate the lever about the pivot and to cause the free end of the second arm to apply an extraction force to the modular component. In addition, the free end of the second arm includes a cam, which abuts the modular component while the free end of the first arm includes a tool-receiving socket. The method further includes the steps of passing a matching tool into the socket, and applying an actuating force with the tool to a wall of the socket while the cam applies an extraction force to the modular component.

BRIEF DESCRIPTION OF THE DRAWINGS

The teachings of the present invention can be readily understood by considering the following detailed description in conjunction with the accompanying drawings, in which.

DETAILED DESCRIPTION OF THE PREFERRED EMBODIMENT

Figure 1:
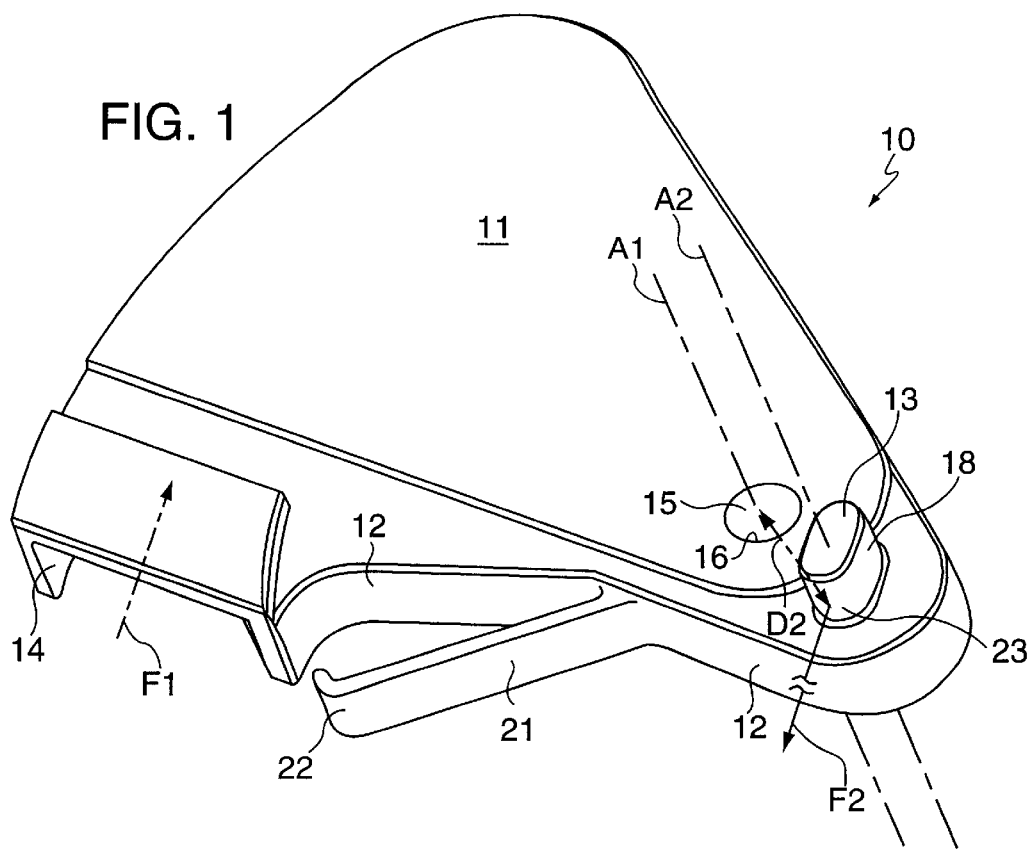
FIG. 1 is a pictorial view showing the top and front of an ejector in accordance with the present invention.
Figure 2:
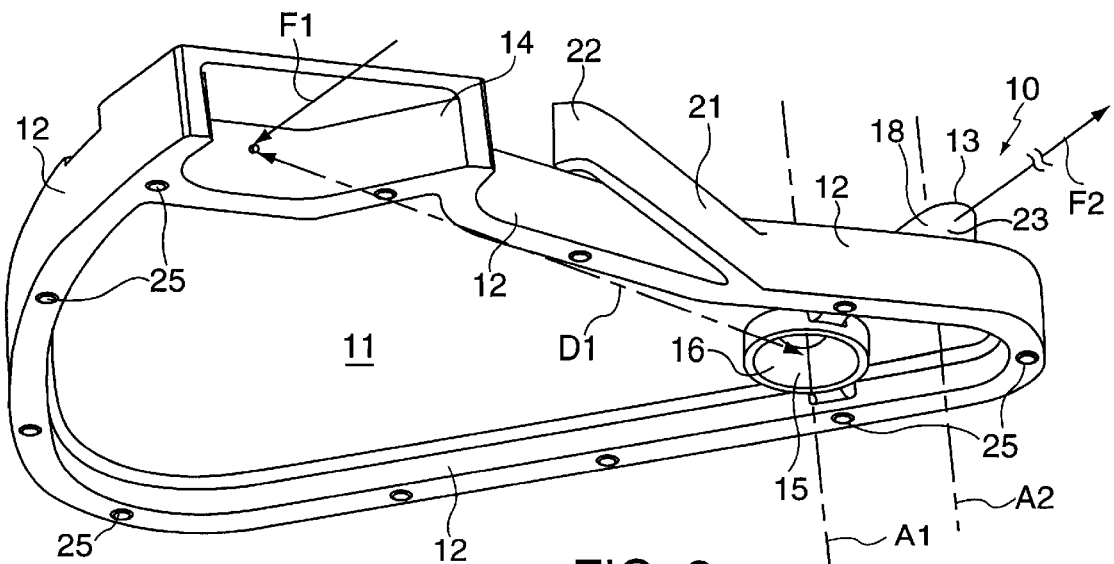
FIG. 2 is a pictorial view showing the bottom and front of the ejector of FIG. 1.
Figure 3:
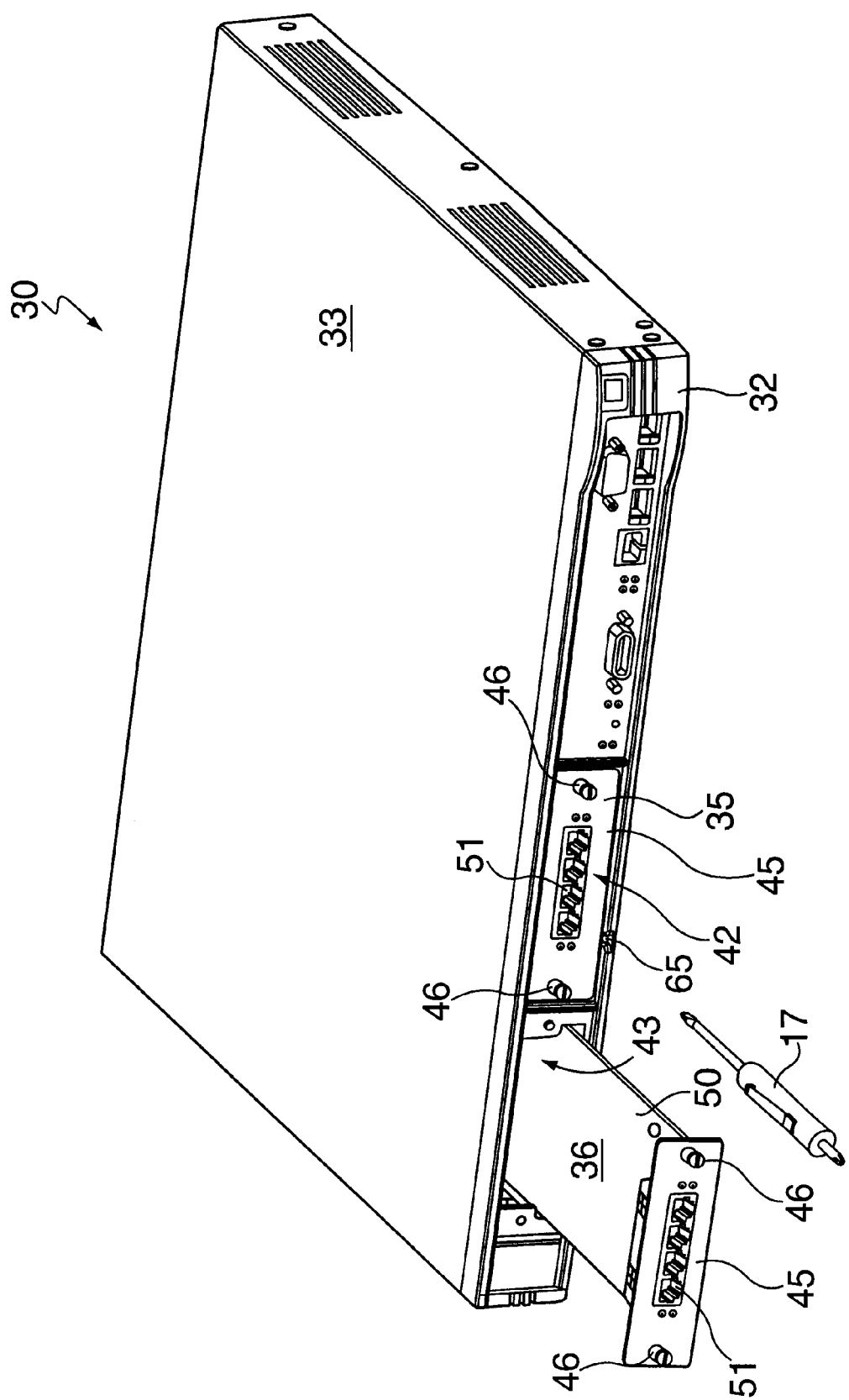
FIG. 3 is a pictorial view showing the top and front of a modular electronic device comprising ejectors in accordance with the present invention.

Referring now to the drawings, FIGS. 1 and 2 show tool-actuated ejector 10 molded as a unitary structure having a generally planar body 11 edged with depending flange 12. Ejector 10 comprises cam 13, tool socket 14, pivot collar 15 and resilient arm 21. Pivot collar 15 depends from the underside of body 11 near a first end thereof. Cylindrical opening 16 passes through collar 15 and centers on axis A1. Cam 13 mounts on and extends above the upper surface of body 11 between pivot collar 15 and the first end of body 11. Cam 13, which has an oval cross section, comprises a cylindrical outer surface 18 centered on axis A2. Surface 18 includes cam face 23 directed toward the front of ejector 10. Axes A1 and A2, of cam 13 and opening 16, respectively, extend parallel to each other and perpendicular to body 11.

At a second end of body 11, flange 12 forms tool socket 14 with an entrance port that opens toward the front of ejector 10. An outer surface of flange 12 cantilevers resilient arm 21 at the front of ejector 10 between cam 13 and socket 14. An unattached end of arm 21 includes cam surface 22. In response to forces applied to surface 22, arm 21 will resiliently bend toward flange 12 in a plane parallel to the plane of body 11. Spaced about a bottom surface of flange 12 are protuberances 25, which function as gliders on which ejector 10 rides.

In general, ejector 10 functions as a levered cam that rotates about axis A1 in response to an applied force F1. Ejector 10 comprises a first lever arm represented by distance D1 (see FIG. 2) between the back face of socket 14, where a tool actuates ejector 10, and axis A1, the pivot axis of ejector 10. A second lever arm represented by distance D2 (see FIG. 1) extends between axis A1 and cam face 23 of cam 13. As seen in FIGS. 1 and 2, distance D1 is substantially greater than that of distance D2. Thus, ejector 10 multiplies applied force Fl by the ratio of distances D1 and D2 to produce a substantially greater extraction force F2 at cam face 23 in accordance with the following expression:

$$F2=(F1)(D1)/(D2).$$

Figure 4:
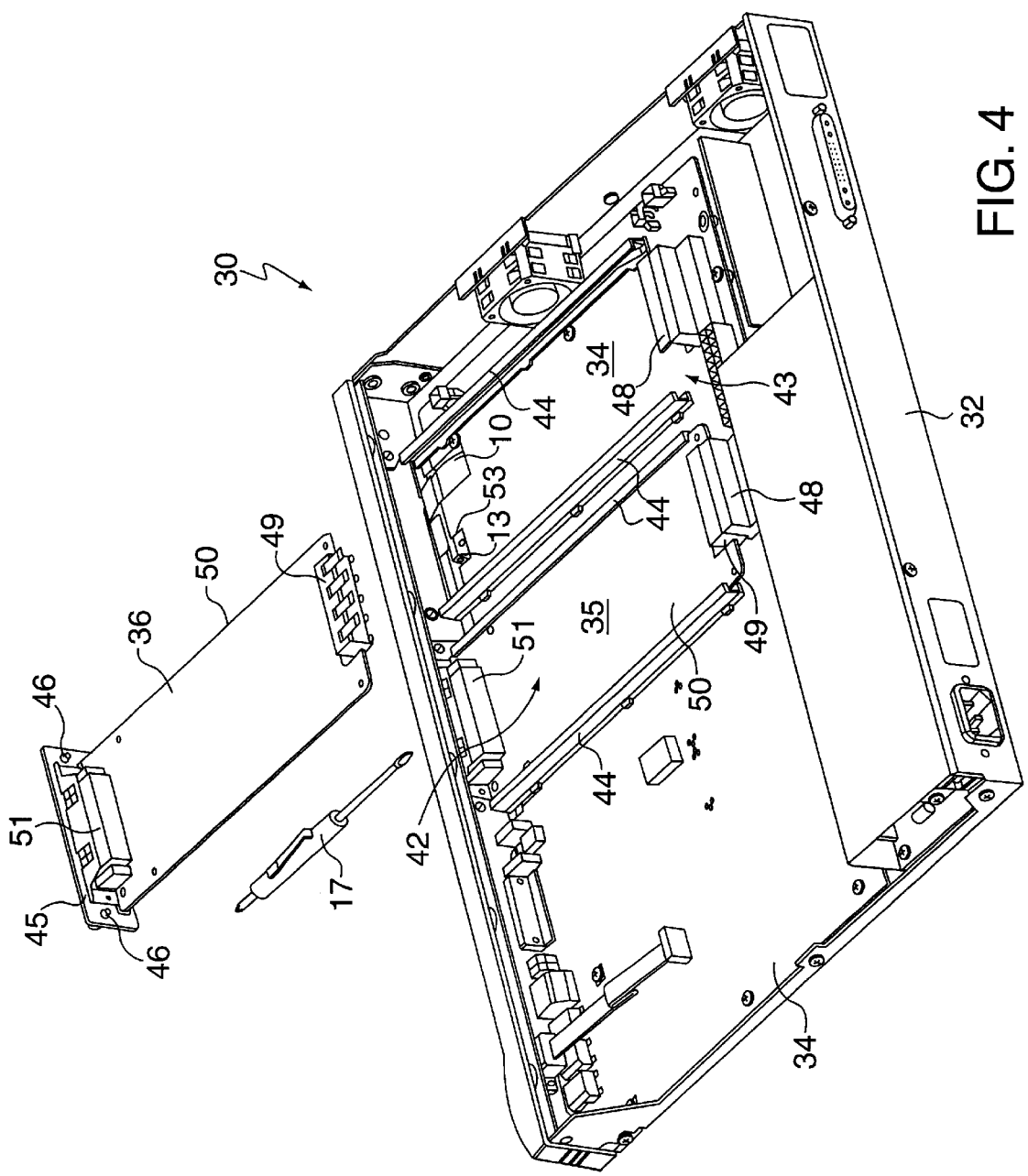
FIG. 4 is a pictorial view showing the top and back of the modular electronic device of FIG. 3 with its cover removed.
Figure 5:
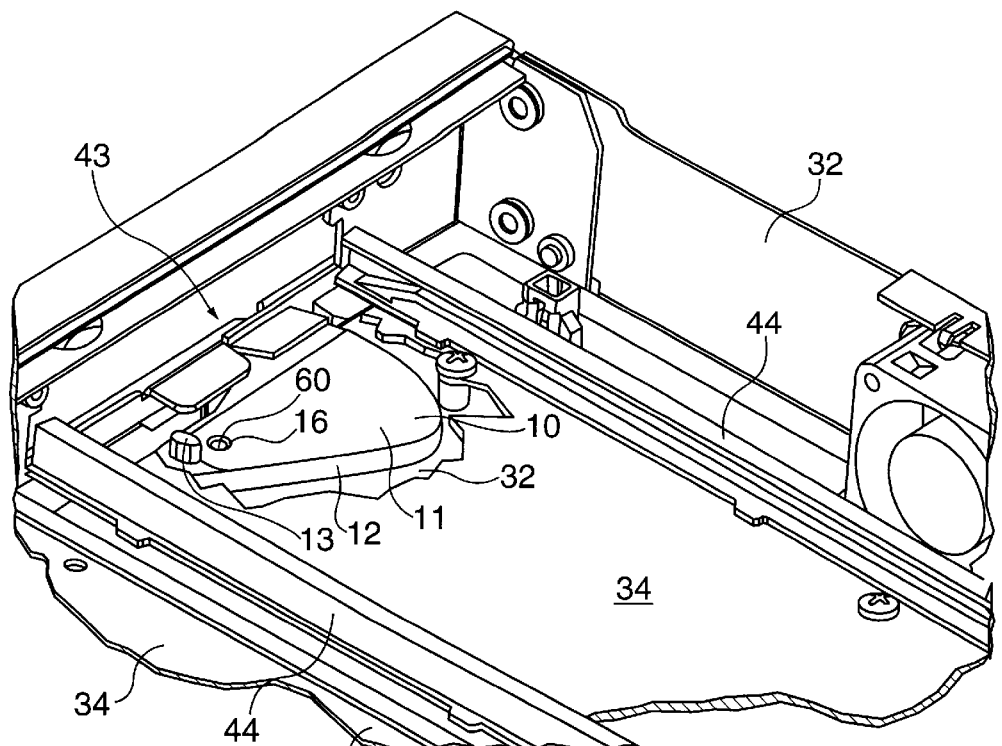
FIGS. 5 and 6 are pictorial views with parts cut away showing portions of the modular electronic device of FIGS. 3 and 4.
Figure 6:
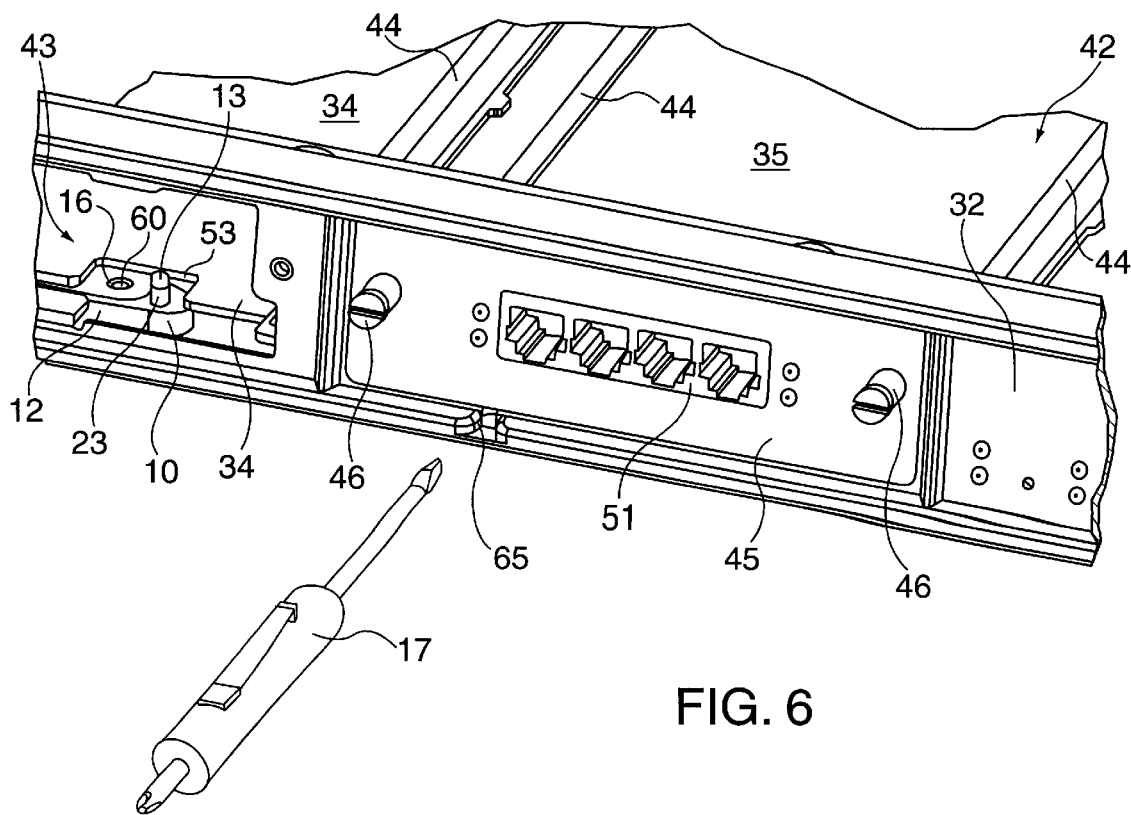
Figure 7:
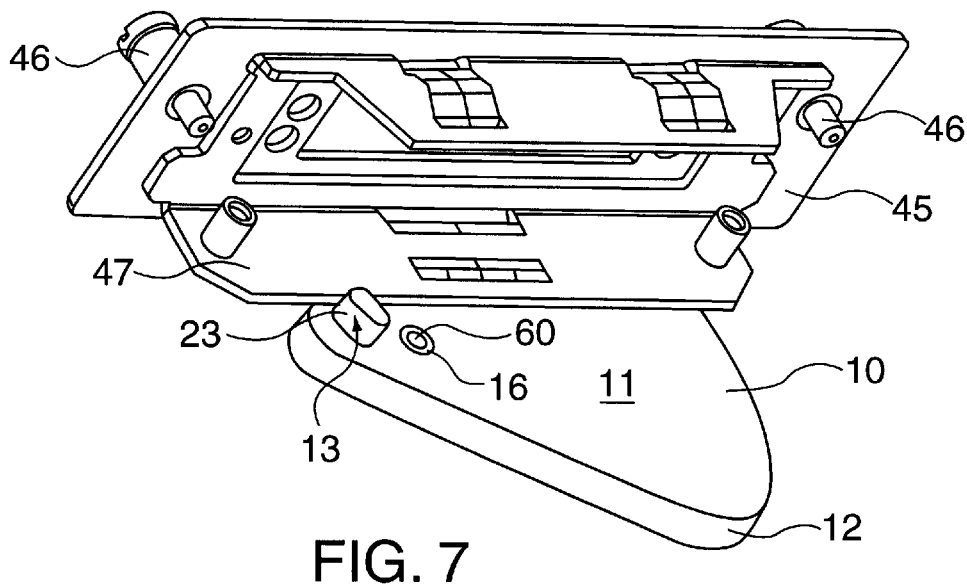
FIGS. 7 and 8 are pictorial views showing the ejector of FIGS. 1 and 2 engaging a panel of a circuit board in accordance with the present invention.
Figure 8:
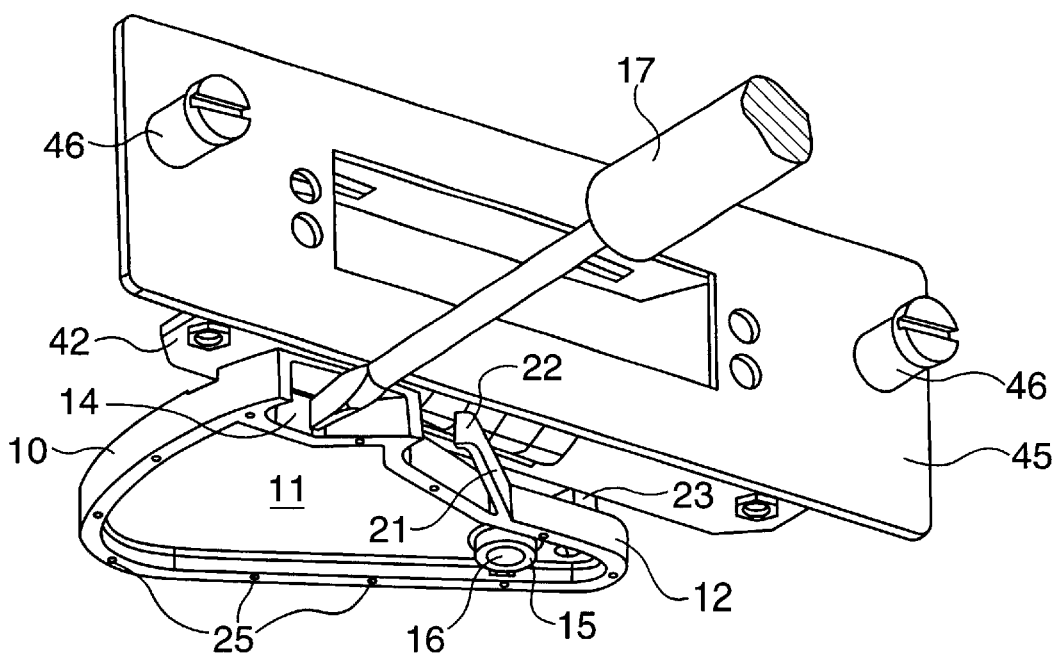
Figure 9:
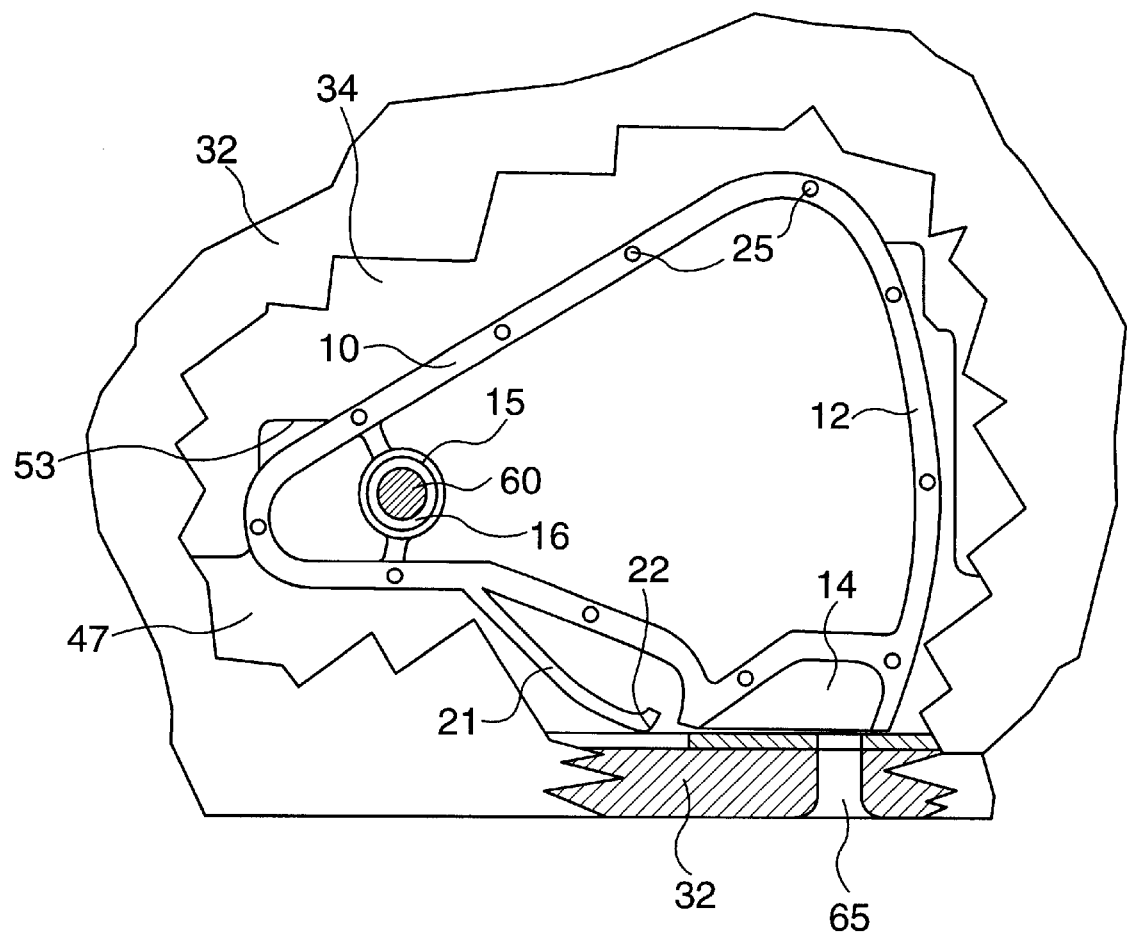
FIG. 9 is a bottom view, with parts broken away, illustrating portions of the ejector of FIGS. 1 and 2 mounted in the electronic device of FIG. 3.

Detailed descriptions of the operation of ejector 10 and the functions of its various parts appear below with respect to its use in modular electronic device 30. FIGS. 3–9 show modular electronic device 30 employing two ejectors 10, each of which is actuated with a tool, which in this case comprises a blade of conventional screwdriver 17. Electronic device 30 illustratively represents a PC peripheral (e.g., a modem) or other electronic modular device. Chassis 32 and cover 33 form a casing, which encloses multiple electronic components including motherboard 34. As best seen in FIG. 4, the walls of chassis 32 have several openings for receiving a variety of conventional components, such as cable connectors, fans, switches, display lights, and two similarly shaped, plug-in circuit board assemblies 35 and 36. For simplicity, FIGS. 3–6 show only a limited number of components on motherboard 34, and board assemblies 35 and 36. However, like most ordinary PCB assemblies, motherboard 34, and board assemblies 35 and 36 would normally contain arrays of etched, interconnected conductors, and several fixed and/or removable components. In addition, with respect to those components of electronic device 30 depicted in FIGS. 3–9, reference characters and descriptions appear for only the more significant components.

Board assemblies 35 and 36 represent ordinary plug-in expansion or option boards found in many conventional electronic devices. Board assemblies 35 and 36 each comprise circuit board 50, input-output (I/O) panel 45 and male connector 49. I/O panels 45 mount at one end of circuit boards 50 while connectors 49 mount at an opposite end. I/O panels 45 comprise fasteners 46, which secure panels 45 to chassis 32, and conventional jack assemblies 51, which connect to boards 50.

Electronic device 30 further includes slots 42 and 43 for receiving board assemblies 35 and 36, respectively, via access openings located in the front panel of chassis 32. Slots 42 and 43 each includes one ejector 10, a pair of board guides 44 and a female connector 48. Ejectors 10, which mount below motherboard 34, pivot on upstanding axles 60 fixed to the bottom wall of chassis 32. Cams 13, of ejectors 10, pass through notches 53 in motherboard 34 and extend above the upper surface of motherboard 34. Sockets 14, of ejectors 10, communicate with passages 65 located in the front panel of chassis 32. Board guides 44, which also mount on motherboard 34, guide and hold the edges of boards 50 during and after installation.

When installing circuit boards 35 and 36 in respective slots 42 and 43, an installer begins by inserting board 50 through the appropriate access opening in the front panel of chassis 32. The installer leads with connector 49 while sliding the edges of board 50 within a pair of guides 44. As board 50 slides toward the rear of guides 44, the contacts of male connector 49 align with and plug into the sockets of female connector 48. In addition, as plug-in connectors 48 and 49 mate, an edge of flange 47, mounted on the rear surface of I/O panel 45, contacts cam 13 at a point on cam face 23 (see FIGS. 7 and 8). This action causes ejector 10 to rotate about axis A1. In addition, the entrance port of socket 14 moves into alignment with the rear of passage 65. Further, cam surface 22 engages an inside surface of the front panel of chassis 32, causing resilient arm 21 to bend toward flange 12. Finally, when I/O panel 45 abuts chassis 32, the installer secures fasteners 46 to the front panel of chassis 32.

When removing circuit boards 35 and 36, a user begins by releasing fasteners 46. The user then inserts an appropriate tool, which in this case is screwdriver 17, into socket 14 via passage 65. The user pushes screwdriver 17 towards the rear of device 30 until the blade of screwdriver 17 contacts the rear face of socket 14 with applied force F1. Ejector 10 responds by multiplying force F1 to a substantially greater force, viz., extraction force F2, at cam face 23. Cam face 23 pushes against flange 47 with extraction force F2, causing ejector 10 to pivot. In addition, I/O panel 45 moves away from chassis 32 while male connector 49 unplugs from female connector 48. When the user senses force F1 falling off, confirming that connector 49 unplugged successfully, the user removes screwdriver 17 from passage 65 and grasps I/O panel 45. With the side edges of board 50 sliding in guides 44, the user pulls I/O panel 45 away from chassis 32 until the board assemblies 35 and 36 no longer occupy their respective slots 42 and 43.

Resilient arms 21 help stabilize ejectors 10 when board assemblies 35 and 36 are in their fully plugged in position in respective slots 42 and 43. Specifically, as board assemblies 35 and 36 plug into slots 42 and 43, flanges 47 push cam faces 23 toward the rear, thereby pivoting ejector 10. This action causes a rear surface on the front panel of chassis 32 to press against cam surface 22, thereby flexing arm 21 toward flange 12 (see FIG. 9). In this flexed position, arm 21 will bias ejector 10 in a counterclockwise direction as viewed from the bottom (i.e., as viewed in FIG. 9). Arm 21 biases ejector 10 with a torque that is equal and opposite to the torque flange 47 applies to cam face 23. As such, these equal and opposite balancing torques stabilize ejector 10.

In addition to acting as a stabilizer, resilient arm 21 functions as a shock absorber during installation and removal of board assemblies 35 and 36. The biasing forces exerted by a flexed arm 21 help ejector 10 to pivot in a smooth and uniform fashion during the extracting and plugging-in processes. Resilient arm 21, along with protuberances 25, help to insure smooth movement of ejector 10. Protuberances 25, which support ejector 10, glide with little or no friction on the upper surface of the bottom wall of chassis 32.

Various modifications of the invention are contemplated. To better protect against accidental ejection, ejector 10 may be made more difficult to actuate. It is contemplated, for example, that the cross-sectional shapes of passage 65 and/or socket 14 may be made more complex, thereby requiring the use of tools that are more difficult to acquire. Also in this regard, ejector 10 may be positioned to be accessible only from the interior of the casing or from less accessible locations on the exterior of the casing.

While FIGS. 3–9 illustrate the extraction of circuit board assemblies 35 and 36, it is contemplated that ejector 10 may be appropriately modified to operate with other types of modular components, such as microprocessors, memory chips, cable connectors, etc. In addition, some modular devices employ snap-in type fasteners, which engage automatically when a component or circuit board is installed. Examples of such fasteners include resilient or spring-loaded catches, detents and other types of snap-in devices. It is contemplated that ejector 10 may be used to disengage such fasteners simultaneously with the unplugging of a connector. Of course, various other modifications and variations are contemplated and may obviously be resorted to in light of the present disclosure. It is to be understood, therefore, that within the scope of the appended claims, the invention may be practiced otherwise than as specifically described.

What is claimed is:

1. An ejector for extracting an electronic modular component upon the application of a tool to said ejector, said ejector comprising:

a one-piece body having a relatively planar surface, and having a first end, a second end and a pivot located intermediate said first end and said second end, said first end being spaced from said pivot by a first fixed distance and said second end being spaced from said pivot by a second fixed distance, wherein said one-piece body mounts at said pivot for rotation in the plane of said surface;

a shock absorber mounted on said body;

a tool-receiving socket rigidly fixed to said one-piece body at said second end; and a cam rigidly fixed to said one-piece body at said first end, said cam having means for engaging an electronic modular component with a first force in response to the application of a second force within said tool-receiving socket, and wherein said first force is greater than said second force, and said cam has a cam face oriented perpendicular to said planar body.

2. The ejector of claim 1 wherein said shock absorber includes a resilient arm located between said cam and said socket.

3. The ejector of claim 2 further including a plurality of gliders extending below said body for supporting said ejector for movement on a smooth surface.

4. The ejector of claim 3 wherein said one-piece body, said tool-receiving socket, said cam, said shock absorber and said gliders are a unitary structure.

5. An ejector for extracting an electronic modular component upon the application of a tool to said ejector, said ejector comprising:

a planar one-piece body having a first end, a second end and a pivot collar located intermediate said first end and said second end, said first end being spaced from said pivot collar by a first fixed distance and said second end being spaced from said pivot collar by a second fixed distance, wherein said pivot collar has a cylindrical opening with an axis extending perpendicular to said body;

a flange rigidly joined to and depending from said planar one-piece body;

a resilient arm cantilevered to said flange and located between said cam and said socket;

plurality of gliders extending from said flange to support said ejector for sliding movement on a smooth surface;

a tool-receiving socket rigidly fixed to said planar one-piece body at said second end; and a cam located at said first end and rigidly mounted on said body, said cam having means for engaging an electronic modular component with a first force in response to the application of a second force within said tool-receiving socket, and wherein said first force would be greater than said second force, and said cam has a cam face oriented perpendicular to said body.

6. The ejector of claim 5 wherein said planar one-piece body, said pivot collar, said flange, said tool-receiving socket, said cam, said resilient arm and said gliders are a unitary structure.

7. An electronic apparatus having a modular component mounted therein, said apparatus comprising:
- a casing having an exterior, an interior and means for mounting said modular component, and wherein said casing includes a passage communicating with said tool-receiving socket and said exterior of said casing;
- a first plug-in connector mounted in said interior of said casing;
- a second plug-in connector mounted on said modular component mating with said first plug-in connector;
- an ejector mounted in said interior of said casing for extracting said modular component from said first plug-in connector with a first force upon the application of a second force to said ejector from said exterior of said casing, said ejector comprising a one-piece body having first and second ends, and pivoted to said casing at a pivot point intermediate said first end and said second end, said first end being spaced from said pivot point by a first fixed distance and said second end being spaced from said pivot point by a second fixed distance;
- a shock absorber mounted on said body, said shock absorber including a cantilevered arm having a free end pressing against said casing;
- a plurality of gliders extending below said body for supporting said ejector for rotation on said casing;
- a tool-receiving socket rigidly mounted on said one-piece body at said second end; and
- a cam rigidly fixed to said one-piece body at said first end, said cam having means for engaging said electronic modular component with said first force in response to the application of said second force into said interior of said casing and within said tool-receiving socket, and wherein said first force would be greater than and substantially parallel to said second force, and said cam has a cam face oriented perpendicular to said body.

8. The apparatus of claim 7 wherein said body, said tool-receiving socket, said cam, said shock absorber and said gliders are a unitary structure.

9. An electronic apparatus in combination with a manual ejector tool comprising:
- a modular component;
- an ejector lever having a first end, a second end, and a pivot located intermediate said first end and said second end;
- a casing having an exterior surface and an inside volume, said casing enclosing said ejector lever and having a narrow slot extending from said exterior surface into said interior volume;
- a releasable mounting means located within said casing for mounting said modular component;
- pivot means fixedly mounted in said interior volume for pivotally mounting said ejector lever at a fixed location with respect to said casing such that said second end is in operative communication with said slot;
- a cam means mounted on said ejector lever at said first end for extracting said modular component from said releasable mounting means upon rotation of said ejector lever; and
- the manual ejector tool having an actuator means, including an elongated rigid rod, for manual insertion of said rod through said slot into operative engagement with said second end to cause said rotation of said ejector lever.

10. The electronic apparatus in combination with a manual ejector tool of claim 9 wherein said casing has an inside surface and said pivot means mounts said ejector lever within said casing for sliding rotation on said inside surface.

11. An electronic apparatus in combination with a manual ejector tool comprising:
- a modular component;
- an ejector lever having a first end, a second end, and a pivot located intermediate said first end and said second end, said second end including a tool-receiving socket;
- a casing having an exterior and an interior, said casing enclosing said ejector lever and having a passageway extending from said exterior into said interior such that said tool-receiving socket is aligned with said passageway;
- a releasable mounting means located within said casing for mounting said modular component;
- pivot means located in said interior of said casing for pivotally mounting said ejector lever such that said second end is in operative communication with said passageway;
- a cam means mounted on said ejector lever at said first end for extracting said modular component from said releasable mounting means upon rotation of said ejector lever; and
- the manual ejector tool having an actuator means for manual insertion through said passageway into operative engagement with said second end such that said actuator means selectively extends into said tool-receiving socket to cause said rotation of said ejector lever.

12. An electronic apparatus in combination with a manual ejector tool comprising:
- a modular component;
- an ejector lever having a first end, a second end, and a pivot located intermediate said first end and said second end;
- a casing having an exterior and an interior, said casing enclosing said ejector lever and having a passageway extending from said exterior of said casing into said interior of said casing;
- a releasable mounting means located within said casing for mounting said modular component;
- pivot means located in said interior of said casing for pivotally mounting said ejector lever such that said second end is in operative communication with said passageway;
- a cam means mounted on said ejector lever at said first end for extracting said modular component from said releasable mounting means upon rotation of said ejector lever, and wherein said ejector lever includes a cantilevered arm having bias means for resiliently engaging said casing in response to said modular component engaging said cam means; and
- the manual ejector tool having an actuator means for manual insertion through said passageway into operative engagement with said second end to cause said rotation of said ejector lever.

13. An ejector for extracting an electronic modular component, said ejector comprising:

a lever having a first end, a second end, and a pivot located intermediate said first end and said second end;

a tool-receiving socket rigidly mounted on said lever at said second end;

an ejector cam rigidly mounted on said lever at said first end and spaced from said pivot a distance substantially less than the spacing between said tool-receiving socket and said pivot; and a shock absorber having a resilient arm cantilevered to said lever between said first end and said second end.

14. An electronic apparatus comprising:

a modular component;

a casing having an exterior, an interior and a passageway extending between said exterior and said interior;

a releasable mounting means for mounting said modular component in said casing;

an ejector enclosed in said interior of said casing, said ejector comprising a lever having a first end and a second end, said lever pivoted to said interior of said casing;

a tool-receiving socket rigidly mounted on said lever at said second end in communication with said passageway;

a cam rigidly fixed to said lever at said first end, said cam having means for engaging said electronic modular component with an ejection force in response to the application of an actuating force to said tool-receiving socket via said passageway; and shock absorber mounted on said lever, said shock absorber including a resilient arm cantilevered to said lever and having a free end pressing against said interior of said casing in response to said modular component engaging said cam.

* * * * *